United States Patent [19]

Wanlass

[11] 4,375,087
[45] Feb. 22, 1983

[54] ELECTRICALLY ERASABLE PROGRAMMABLE READ ONLY MEMORY

[75] Inventor: Frank M. Wanlass, Cupertino, Calif.

[73] Assignee: Hughes Aircraft Company, Culver City, Calif.

[21] Appl. No.: 138,806

[22] Filed: Apr. 9, 1980

[51] Int. Cl.³ .................. G11C 13/00; G11C 11/44
[52] U.S. Cl. .................................. 365/218; 365/185; 357/45
[58] Field of Search ............... 365/185, 218, 174, 182, 365/189; 357/4, 24, 43, 45

[56] References Cited

U.S. PATENT DOCUMENTS

| | | | |
|---|---|---|---|
| 4,051,464 | 9/1977 | Huang | 365/218 |
| 4,099,196 | 7/1978 | Simko | 365/218 |
| 4,162,504 | 1/1979 | Hsu | 357/23 |
| 4,184,207 | 1/1980 | McElroy | 365/185 |

*Primary Examiner*—Terrell W. Fears
*Attorney, Agent, or Firm*—Robert M. Wallace; William H. MacAllister

[57] ABSTRACT

A floating gate tunneling metal oxide semiconductor (FATMOS) transistor is formed in a well region on a semiconductive substrate of a conductivity type opposite to that of the well region, so that charging and discharging of the FATMOS floating gate is accomplished by controlling the potential of the well region. As a result, in an electrically erasable programmable read-only memory, each memory cell requires only one FATMOS transistor, the need for an additional control transistor having been eliminated. Selection of individual memory cells is enhanced by providing a floating gate which only partially overlies the FATMOS transistor channel, so that the overlying FATMOS control electrode performs an "and" gate function independently of the floating gate.

20 Claims, 13 Drawing Figures

ELECTRICALLY ERASABLE PROGRAMMABLE READ ONLY MEMORY

TECHNICAL FIELD

The invention is related to minicomputers and in particular to non-volatile read only memories which are programmable and which may be electrically erased by the user. The invention is also related to floating gate tunneling metal oxide semiconductors (FATMOS) devices.

BACKGROUND OF THE INVENTION

Minicomputers typically include a central processing unit which performs computations on data stored in a random access memory in conformance with instructions also stored in the random access memory (RAM). The data and instructions are the software which the user stores ("programs") in the RAM and may be easily changed by the user. The computations performed by the central processing unit in response to the instructions stored by the user in the RAM are controlled by microprograms permanently stored within the central processing unit itself in one of more non-volatile read only memories (ROM).

The versatility of minicomputers has significantly increased recently due in large part to the role played by the ROM. The mode of operation of the central processing unit may be customized for specific applications by programming the contents of the ROM so that the microprograms contained therein and executed by the central processing unit in response to user software are adapted to perform most efficiently for a specific task. In the prior art, a ROM could only be erased by the use of ultraviolet light, a procedure consuming as much as half an hour. Therefore, the user or purchaser of a minicomputer had to rely on the manufacturer to erase and reprogram the ROMs.

A very recent development has been the electrically erasable programmable read only memory (EEPROM) which does not require the use of ultraviolet or other radiation for complete erasure. Whereas in the prior art the minicomputer hardware had to be physically altered by factory technicians in order to reprogram the ROM, an EEPROM requires no such physical alteration inasmuch as erasure is controlled electrically and may therefore be performed by the user simply by entering the correct command into the cental processing unit.

Each cell of the EEPROM is a floating gate tunneling metal oxide semiconductor field effect transistor (FATMOS), a particular type of which is described by U.S. Pat. No. 4,115,914 to Eliyahou Harari entitled "Electrically Erasable Non-Volatile Semiconductor Memory" and assigned to the assignee of the present application. The floating gate of the FATMOS may be electrically charged or discharged to regulate current flow between its source and drain, corresponding to a permanently stored logic "1" or logic "0", respectively.

Currently available EEPROMs capable of storing 8,000 binary bits, for example, include 8,192 FATMOS transistors arranged in a planar matrix of rows and columns, each row of FATMOS transistors having a common control gate and each column of FATMOS transistors sharing commonly connected source and drain diffusions. Thus, each memory cell comprising a single FATMOS transistor is individually addressable by applying electrical signals to a certain row and a certain column of the memory. For example, in order to write a logic "1" or "0" into a particular cell of the memory, a voltage is applied to the control gate corresponding to the row of the selected memory cell while a voltage corresponding to either a logic "1" or "0" is applied to the source or drain corresponding to the column of the selected cell. A significant problem with this arrangement is that it is necessary to provide an additional metal oxide semiconductor field effect transistor (MOSFET) to act as an "AND" gate in each memory cell in order to enable the user to select a single row of memory cells while writing data into the memory without accidently writing or erasing memory cells in other rows.

The current developmental thrust of minicomputer technology is toward dramatic density improvement. Unfortunately, the presence of the additional MOSFET transistor in each memory cell of the EEPROM nearly doubles the size of each memory cell, prompting those skilled in the art to seek solutions which would eliminate the extra MOSFET transistor from each EEPROM memory cell while providing the capability to write a binary bit into a selected memory cell which is addressed according to its row and column without accidentally writing or erasing other cells. One solution discovered in the prior art, commonly called the "half-select" system, is to use three different voltage levels which may be applied to the gate and drain of rows and columns, respectively, of memory cells, each memory cell comprising a single FATMOS transistor only. The potential difference between the highest and lowest voltage level in this system is sufficient, when applied between the substrate and the overlying control gate, to charge or discharge the FATMOS floating gate in order to write or erase data, while the third voltage level is intermediate between these two levels. When a single memory cell is selected for writing, some memory cells have no potential difference between their control gate and drain ("no select"), others have only half the requisite voltage difference between their control gate and drain ("drain select") by reason of the application of the intermediate voltage level to these cells, and only the selected memory cell has the full voltage difference between its control gate and drain. A significant disadvantage of the half-select system is that the memory cells which are half selected are subject to some accidental charging or discharging of their floating gates. Therefore, although the half-select system does eliminate the extra MOSFET transistor from each memory, the system is unreliable in that many memory cells may experience accidental writing, generating bit errors in the memory.

It has therefore been a goal in the art to provide an EEPROM which does not require an additional MOSFET transistor in each memory cell and which does not require the use of a half-select system, and yet provides a reliable selection of a single memory cell for writing data while precluding accidental simultaneous erasure or writing in non-selected cells.

SUMMARY OF THE INVENTION

The FATMOS transistor of the present invention is useful as a single cell of a novel EEPROM having only one transistor in each of its memory cells while not requiring use of the half-select system of the prior art. The FATMOS transistor of the present invention is formed as an n-channel device in a p-type well on a n-type substrate. The advantage of the p-type well is that its potential may be raised or lowered to control the charging and discharging (writing and erasing) of the floating gate with electrons. Charging of the floating gate is performed by diverting electrons from the source-to-drain channel when the device is turned on by an overlying control gate held at a positive potential. In order to eliminate the necessity for the additional MOSFET transistor in each memory cell, the potentials of the well region and the sources and drains of unselected FATMOS memory cells are chosen during write operations to prevent minority carriers from discharging from any of the floating gates to the substrate while permitting an individually selected floating gate to be charged. Specifically, all of the FATMOS devices in the common p-type well region are first erased by holding the p-type well region at a positive potential while holding the overlying control gates at ground potential to cause electrons stored on the floating gates to discharge to the substrate. During the subsequent write operation, the p-type well region is held at a ground potential while the overlying control gate lines of unselected FATMOS devices are also held at ground potential. Furthermore, the source and drain lines of all the FATMOS devices are held at a positive potential, while the gate line overlying the FATMOS device selected for writing is also held at a positive potential. If a logic "1" is to be written into the selected FATMOS device, then its source line is held at ground potential to create a source-to-drain current of electrons to provide a supply of electrons to tunnel from the channel to the floating gate, the tunneling electrons being attracted by the positive potential of the selected overlying control gate. Otherwise, if a logic "0" is to be stored in the selected FATMOS device, its source line remains at a positive potential so that the selected FATMOS device has no source-to-drain electron current and its floating gate does not change its charge. There is substantially no electric field in any FATMOS cell during write operations which can attract minority carriers on a floating gate to discharge or tunnel to the underlying channel.

Another advantage of invention is that all of the memory cells may be electrically erased simultaneously by setting the well to an attractive (positive) potential and setting all of the overlying control gates to ground potential.

Another feature of the invention is that the source-to-drain channel region is divided into two portions arranged serially with respect to the source and drain, the floating gate regulating current flow in the first portion and the overlying control electrode independently regulating current flow in the second portion so that the overlying control electrode provides an "AND" function during read or write operations, enhancing the reliability with which the control electrode can "unselect" a memory cell.

BRIEF DESCRIPTION OF THE DRAWINGS

The invention is best understood by reference to the accompanying drawings, of which:

FIG. 4b is a sectional view corresponding to the plan view of FIG. 4a;

FIG. 5 is a simplified schematic diagram illustrating the operation of a single EEPROM cell of the present invention, of which:

DETAILED DESCRIPTION OF THE INVENTION

Figure 1:
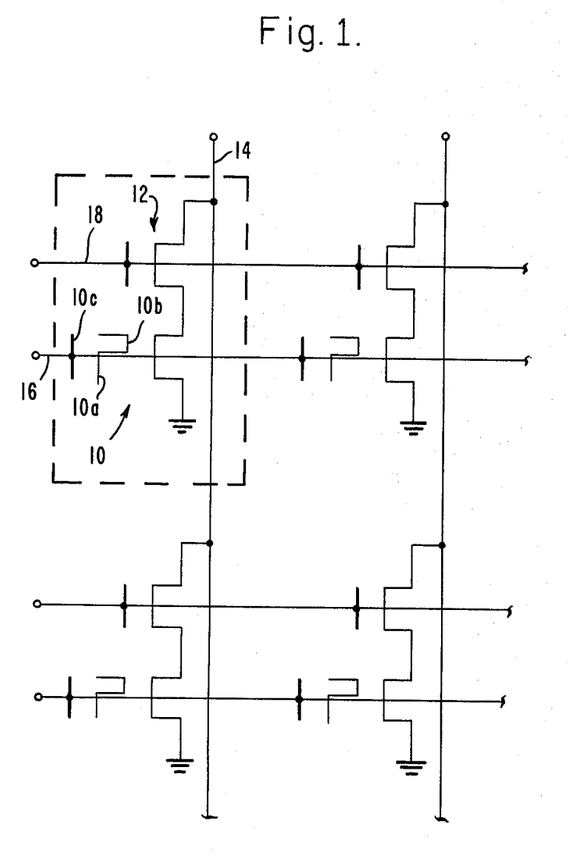
FIG. 1 is a schematic diagram of an EEPROM of the prior art having two transistors in each memory cell.

Referring to the schematic diagram of FIG. 1, an EEPROM of the type discussed in Johnson et al, "16-K EE-PROM Relies on Tunneling for Byte Erasable Program Storage," *Electronics*, pp. 113–117, Feb. 28, 1980, includes a plurality of FATMOS transistors similar to the type disclosed in U.S. Pat. No. 4,115,914, referred to above. The structure of the FATMOS transistor is well-known and includes a floating gate 10a having a tunneling portion 10b, located on the order of 100–200 Angstroms from the underlying semiconductive substrate, through which the minority carriers may tunnel to charge or discharge the floating gate 10a under the influence of an applied electric field, and an overlying control electrode 10c. The drain of the FATMOS transistor 10 is connected through a row select MOSFET transistor 12 to a column data line 14, the column data line 14 being similarly connected through other row select transistors 12 to other FATMOS transistors 10 which are in the same vertical column. Each transistor pair 10, 12 comprises a single cell of the EEPROM of FIG. 1.

Each memory cell is erased by causing its floating gate 10a to be completely charged with minority carriers (electrons) so that the floating gate maintains the FATMOS transistor 10 in the "off" state (logic "0") in which no current may flow between the source and drain of the FATMOS transistor 10. Writing a logic "1" into a memory cell 10, 12 requires discharging the electrons from the floating gate. Each memory cell is read by sensing the source-to-drain voltage of the FATMOS transistor 10 while a positive voltage is applied to the control electrode 10c. The erase, write and read operations are performed under the control of voltages applied to each program line 16 (connected to all of the control gates 10c of a row of FATMOS transistors 10), each select line 18 (connected to all of the gates of a row of MOSFET transistors 12) and each column data line 14. Data may be erased, read or written by controlling the program, data and select lines 14, 16, 18 of the selected memory cell in accordance with the following table specifying the line voltage for each given operation.

TABLE "A"

| Line | Erase | Write "0" | Write "1" | Read |
|---|---|---|---|---|
| Select | +20v | +20v | +20v | +5v |
| Program | +20v | 0v | 0v | +5v |
| Data | 0v | 0v | +20v | (Output) |

The additional MOSFET 12 is necessary to prevent reading or writing of data in memory cells in a column other than that of the selected cell. However, each MOSFET 12 consumes a significant amount of space, increasing the size of each memory cell by nearly a factor of 2, severely limiting the extent to which such an EEPROM can be miniaturized to increase its density, a significant disadvantage.

Figure 2:
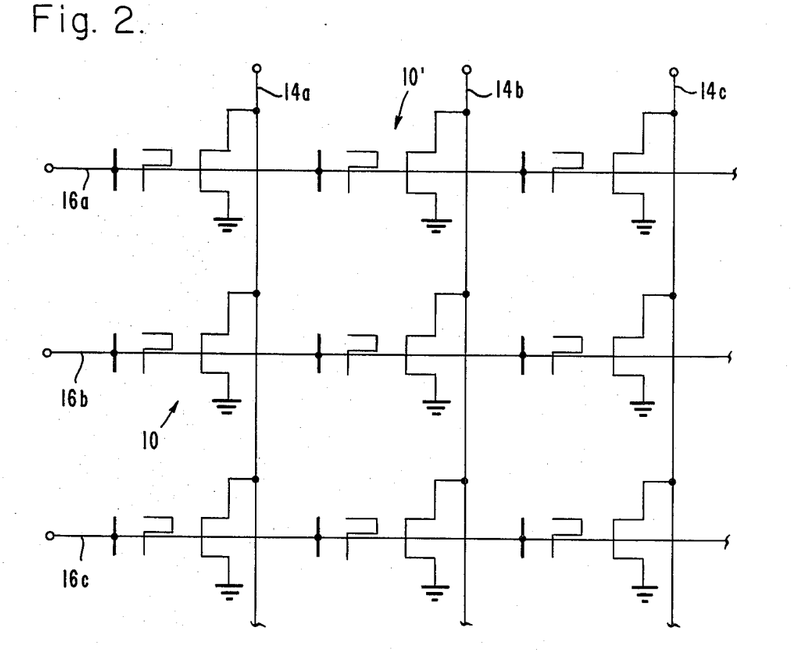
FIG. 2 is a schematic diagram of a half-select system EEPROM of the prior art.
Figure 3:
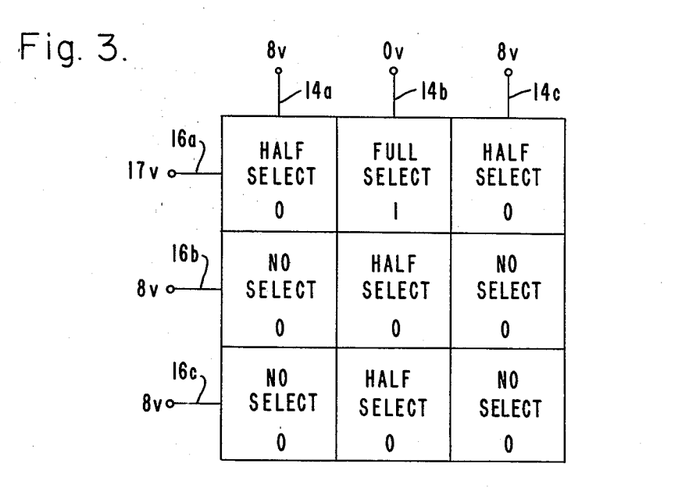
FIG. 3 is a diagram illustrating the operation of the half-select EEPROM of FIG. 2.

In the prior art, the additional control transistor 12 in each memory cell 10, 12 has been eliminated in the half-select system illustrated in the schematic diagram of FIG. 2. The half-select EEPROM of FIG. 2 permits writing into a selected memory cell without erasing or writing in other cells by use of a tri-level voltage system applied to the column data lines 14 and the row program lines 16 controlling each FATMOS transistor 10. Unfortunately, the use of a tri-level voltage system to achieve bit selectable writing is unreliable in that, during a writing operation, some of the unselected memory cells may also be written or erased, depending upon their position. For example, referring to the diagrammatic representation of FIG. 3, if all the memory cells 10 have been erased and it is desired to write a logic "1" into the memory cell 10', 0 volts is applied to the data line 14b while +17 volts is applied to the program line 16a to create a potential difference of +17 volts between the control gate and substrate of the FATMOS transistor 10', the 17 volt difference being just sufficient to discharge electrons from the floating gate to write a logic "1" therein. In order to prevent writing in other memory cells in the row 16a, 8 volts must be applied to all other data column lines 14a, 14c, and may also be applied to all other program lines 16b, 16c so that no other cells have a 17 volt control-gate-to-substrate potential, thus avoiding writing or erasure in unselected cells. As a result, the control gate-to-substrate potential in unselected memory cells 10 is either 0 volts ("no select") or is 9 volts ("half-select") depending upon the memory cell location. The 9 volt control-gate-to-substrate potential in the half-selected memory cells should be insufficient to cause tunneling between the floating gates and the substrate. Unfortunately, some leakage current typically occurs in the half-selected memory cells, thus creating bit errors. As a result, the half-select system is unreliable.

In summary, it has been a desirable goal in the art to provide a reliable bit-selectable electrically erasable programmable memory without the use of an extra control MOSFET 12 and without having to use the half-select system discussed above.

Figure 4A:
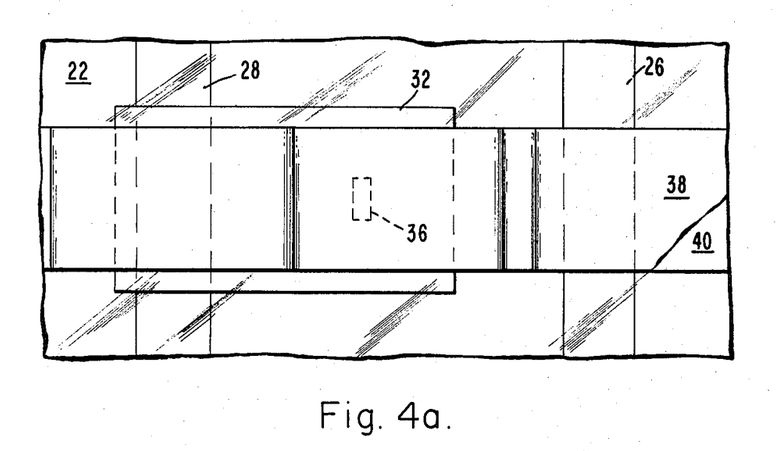
FIG. 4a is a simplified plan view of the EEPROM FATMOS transistor of the present invention.
Figure 4B:
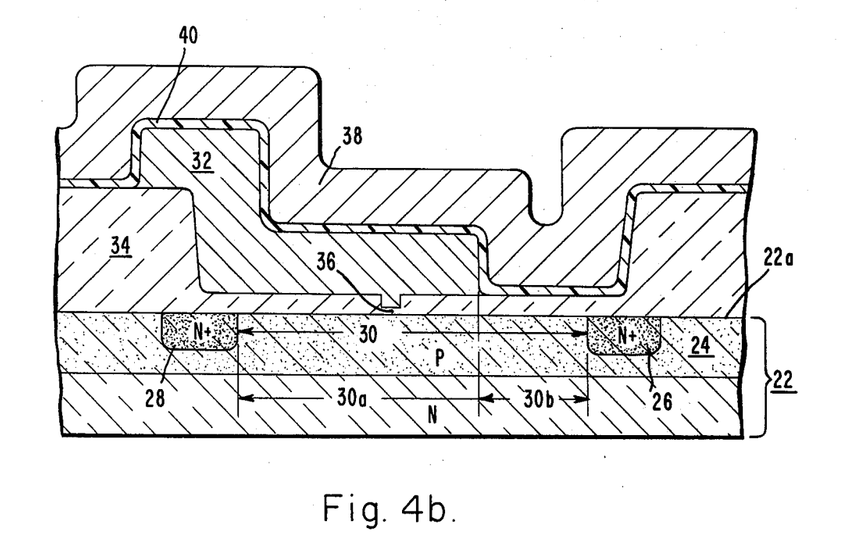

Referring to FIGS. 4a and 4b, the novel FATMOS transistor 20 of this invention facilitates bit selectable writing without requiring any other transistors in the memory cell and without use of the unreliable half-select system. The FATMOS transistor 20 includes a semiconductive substrate 22 of n-type conductivity and a well region 24 of p-type conductivity.

The well region 24 permits changing of the substrate surface potential at the source-to-drain channel region without requiring the control gate voltage or the source and drain potentials to be changed, so that writing in a selected memory cell may be performed in a novel manner while reliably preventing erasure or writing in unselected memory cells, as will be described in this specification. Use of the well region 24 thus eliminates the necessity of an additional transistor in each cell or the use of half-select writing systems of the prior art.

Source and drain diffusions 26, 28 respectively, which may be shared with other FATMOS transistors (not shown in FIGS. 4a and 4b), are formed in the top surface 22a of the semiconductive substrate 22 inside the well region 24 to define a channel region 30 therebetween through which minority carriers (electrons) may flow from the source 26 to the drain 28. A polycrystalline silicon floating gate 32 overlies the channel region 30, being insulated therefrom by a gate oxide dielectric layer 34. A thin tunneling region 36 (approximately 100 to 200 Angstroms thick) permits electrons to tunnel between the substrate channel region 30 and the floating gate 32 under the influence of an electric field applied by an overlying aluminum control gate 38, the control gate 38 being insulated from the floating gate 32 by a thin underlying silicon nitride layer 40.

Figure 5A:
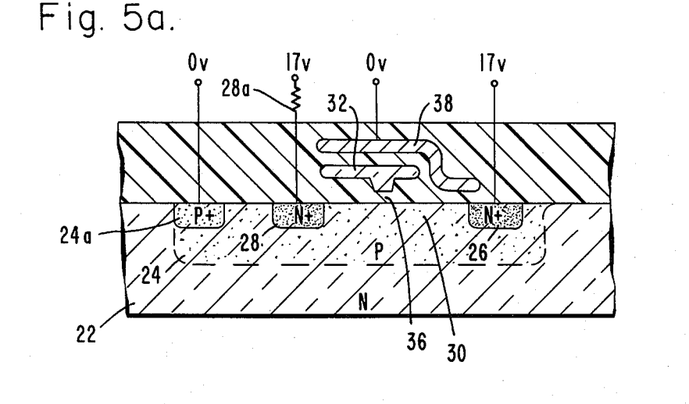
FIG. 5a illustrates the EEPROM cell before an erase operation.
Figure 5B:
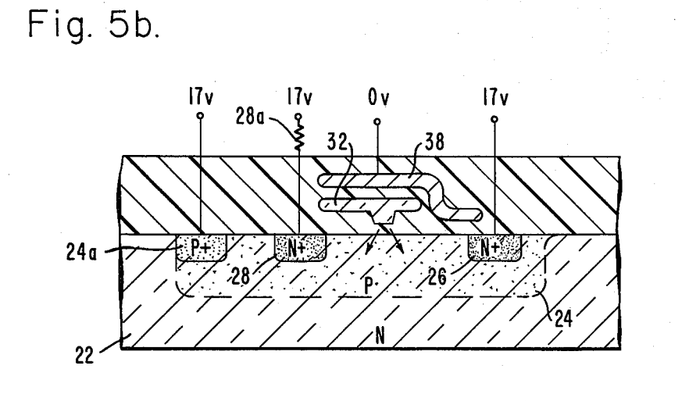
FIG. 5b illustrates the EEPROM cell during an erase operation.

The memory cell 20 is erased by discharging electrons previously stored on the floating gate 32 in accordance with the procedure illustrated in FIGS. 5a and 5b. Before erasure, the FATMOS memory cell 20 is placed in the preparatory state illustrated in FIG. 5a by grounding the well region 24 through a region 24a of increased p-type conductivity. The source and drain 26, 28 are each maintained at a potential of +17 volts while the overlying control gate 38 is held at ground potential. Because the well region 24 is grounded, the channel 30 is held at a low potential despite the +17 volts applied to the source and drain 26, 28, so that no erasure may occur at this time. Thereafter, the potential of the well region 24 is raised to +17 volts so that the potential difference between the channel region 30 and the overlying control gate 38 is on the order of +17 volts, creating an electric field that causes electrons stored on the floating gate 32 to tunnel through the thin tunnel region 36 into the channel region 30 to discharge the floating gate 32.

Figure 5C:
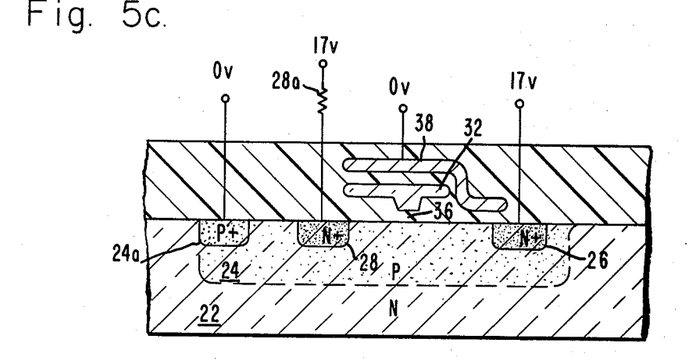
FIG. 5c illustrates the EEPROM cell before a write operation.
Figure 5D:
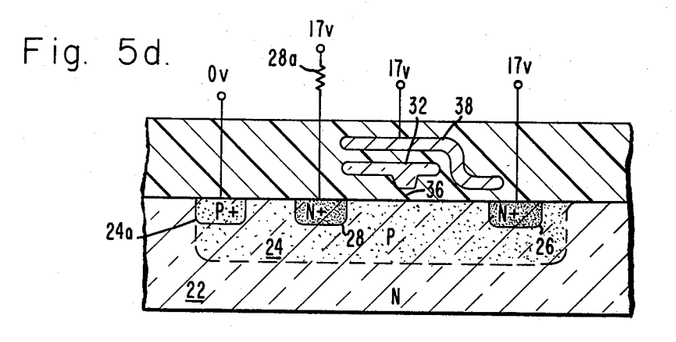
FIG. 5d illustrates the EEPROM cell during a write "0" operation.
Figure 5E:
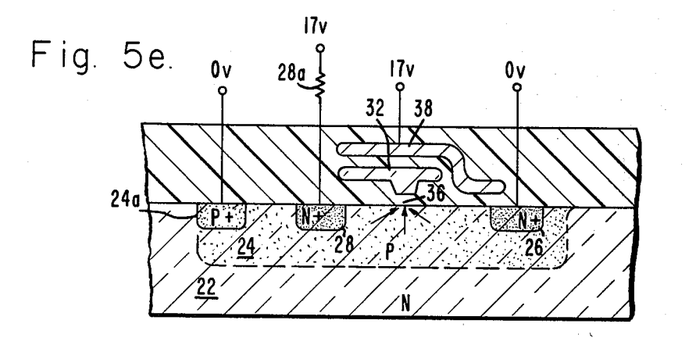
FIG. 5e illustrates the EEPROM cell during a write "1" operation.

A logic "1" may be written into a selected FATMOS memory cell 20 by charging the floating gate 32 with electrons through the tunneling region 36 in accordance with the write procedure illustrated in FIGS. 5c, 5d and 5e. First, the memory cell 20 is placed in the preparatory state illustrated in FIG. 5c by grounding the well region 24, applying a +17 volt potential to the source 26 and to the drain 28 through a resistor 28a and grounding the overlying control gate 38. (The resistor 28a should have a resistance greater than the source-to-drain impedance of the FATMOS device.) Grounding of the well region 24 reliably prevents erasure of any FATMOS cells sharing the same well region 24 with the selected cell 20. Thereafter, the potential of the overlying control gate 38 of the selected memory cell 20 is raised to +17 volts. At this time, the surface potential of the channel region 30 is less attractive to electrons than the potential of the source 26 so that substantially no electrons flow from the source 26 into the channel region 30 and thermally generated electrons in the substrate 22 are attracted to the source 26 or drain 28 rather than to the surface of the channel region 30, so that substantially no electrons tunnel through region 36 from the channel region 30 to the floating gate 32. Therefore writing is reliably prevented.

In order to write a logic "1" into the selected memory cell 20, not only must the potential of the control gate 38 be raised to +17 volts, but the voltage level of the source 26 must be dropped to ground (or at least sufficiently lowered) so that electron minority carriers may flow freely from the source 26 to the drain 28. As soon as current begins to flow freely in the channel 30, its surface potential drops to approximately ground, immediately creating an attractive electric field by reason of the +17 volts applied to the overlying gate electrode 38, so that some of the minority carrier electrons flowing in the channel 30 penetrate the tunneling region 36 to charge the floating gate 32, as illustrated in FIG. 5e. The writing operation illustrated in FIGS. 5c-e will not occur unless both (a) the voltage of the source 26 is decreased substantially below +17 volts and (b) the voltage applied to the control gate 38 is increased from 0 volts to 17 volts. For example, if the control gate 38 is maintained at ground potential (0 volts), there is no electric field sufficient to invert the channel 30 so that no writing can occur in the memory cell 20 even though the source 26 is grounded and thus the cell 20 is "unselected" by the control gate 38.

Reading of the memory cell 20 is performed by sensing the source-to-drain voltage of the FATMOS transistor 20 while the drain 28 is connected to a +17 volt supply through the resistor 28a. If, for example, a logic "1" has been written in the cell 20, the floating gate 32 will have been charged with electrons, creating a repulsive (negative) electric field exerted by the floating gate 32 to prevent minority carrier current flow through the channel 30 regardless of whether a positive voltage is applied to the control gate 38, causing the source-to-drain voltage to be at maximum level (approximately 17 volts). On the other hand, if a logic "0" has been written into the memory cell 20, the floating gate 32 is not charged with electrons. In this case, minority carriers may flow across the entire channel 30 when a positive voltage greater than the threshold voltage of the FATMOS transistor 20 is applied to the overlying control electrode 38, the source-to-drain voltage being thereby reduced to a minimum (approximately 0 volts).

Significantly, if the control gate 38 remains grounded, there is no electric field to cause inversion in the channel 30 so that the state of the floating gate 32 has substantially no effect on the voltage sensed (or "read") at the source 26, and thus the FATMOS cell 20 is effectively "unselected" by the control gate 38.

In order to increase the reliability with which the control gate 38 may "unselect" a FATMOS cell 20, the floating gate 32 only partially spans the channel 30, the remainder of the channel 30 being spanned by the overlying aluminum control gate 38. Thus, referring to FIG. 4b, minority carrier current flow in the channel 30 is divided between a first portion 30a of the channel underlying the floating gate 32 and a second portion 30b underlying the control gate 38. If, for example, the floating gate 32 somehow causes inversion of its underlying channel portion 30a, reading or writing of the cell 20 is prevented nevertheless, as long as the voltage applied to the control gate 38 is maintained at ground potential, because inversion of the second channel portion 30b is prevented. Thus, the control gate 38 performs an additional "and-gate" function by positively preventing source-to-drain current flow whenever it is grounded.

Figure 6:
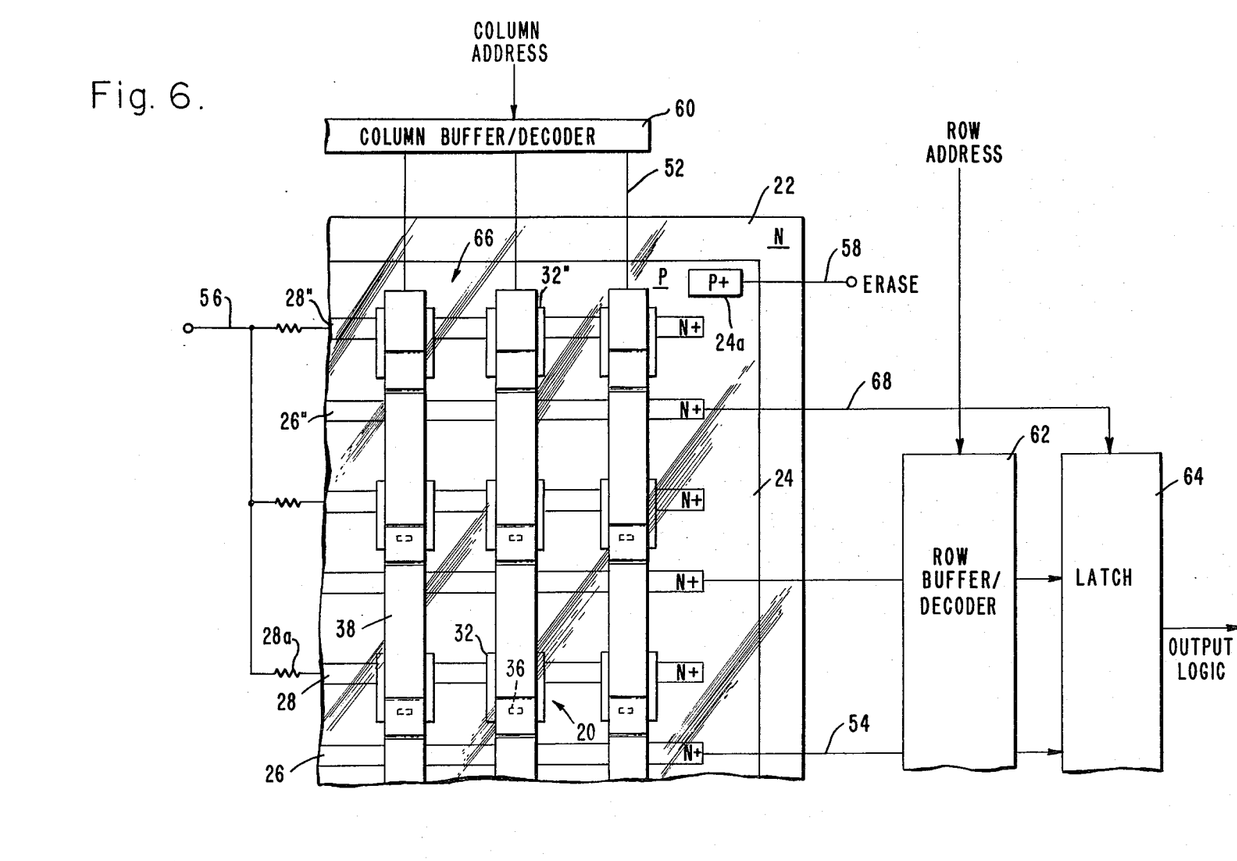
FIG. 6 is a simplified plan view of the EEPROM of the present invention in which each memory cell comprises the novel FATMOS device of FIG. 4.

The foregoing advantages are best exploited in the preferred embodiment of the invention shown in the plan view of FIG. 6 illustrating a corner of a semiconductive substrate 22 of n-type conductivity. The p-type well region 24 is formed over a large area of the top surface of the substrate 22. Each source diffusion 26 extends transversely, being shared among a plurality of FATMOS transistors 20 arranged in a transverse row in the well region 24. Each corresponding drain diffusion 28 is likewise shared in common by the same row of FATMOS transistors 20. Each FATMOS transistor 20 includes one floating gate 32 and its associated tunneling portion 36. Each overlying control gate 38 is shared in common by another plurality of FATMOS transistors 20 arranged in a longitudinal column so that each FATMOS transistor 20 in a particular row and column is comprised of a source/drain pair 26, 28 of diffusions extending transversely in the row and a control gate 38 extending longitudinally in the column. Erase, write and read operations are performed by controlling the voltages applied to a plurality of select lines 52 (connected individually to the control gates 38 in each of the columns), a plurality of data lines 54 (connected individually to the common source diffusion 26 in each of the rows), drain line 56 (connecting all drain diffusions 28 to a +17 volt supply through individual resistors 28a) and an erase line 58 (connected to the region 24a of increased p-type conductivity in the well 24). It should be noted that the drains 28 may be controlled individually rather than being connected in common to the drain line 56 through the individual resistors 28a. In order to write data into a selected one of the memory cells 20, its column is addressed by raising the potential applied to the corresponding select line 52 to +17 volts while maintaining the other select lines 52 at ground potential and grounding the data line 54 of the corresponding row while maintaining the other data lines 54 at +17 volts so that only the selected memory cell 20 in the corresponding row and column has a logic "1" written in it.

It should be noted that, even though an attractive potential of +17 volts exists at this time between the grounded control gates 38 of unselected memory cells and their sources and drains 26, 28, electrons which may be stored on the floating gates 32 of the unselected cells do not discharge to the channel 30 because the well region 24 is also grounded, thus reliably preventing erasure of unselected cells during writing.

Alternatively, an entire column of memory cells 20 may be simultaneously selected and written with logic ones and zeros by applying +17 volts to their select line 52 while grounding all others, and controlling all of the data lines 54 simultaneously in accordance with the write procedure discussed above in connection with FIGS. 5c-5d, so that logic "1"s are simultaneously written into particular ones of the memory cells 20 in the selected column.

Data may be read from a selected individual memory cell 20 in a given row and column by increasing the voltage on the corresponding select line 52 of the given column to at least the threshold gate voltage (typically +5 volts) while maintaining all other select lines at ground potential and sensing the voltage on the data line 54 of the given row. A column of memory cells 20 may also be read simultaneously by raising the voltage on the select line 52 of the selected column and sensing the voltage on all the data lines 54 simultaneously.

In the preferred embodiment illustrated in FIG. 6, a central processing unit (not shown) may address an individual cell 20 of the memory of FIG. 6 by addressing an individual column through a column buffer decoder 60 controlling the voltage on each select line 52, and through a row buffer decoder 62 controlling the voltage on each data line 54. The buffer decoders 60 and 62 may be used by the central processing unit to perform the bulk erase operation on all memory cells and the write and read operations on an individual selected memory cell 20 discussed previously in connection with FIGS. 5a-5d, by simultaneously manipulating the voltages applied to the select lines 52, the data lines 54, the drain line 56 and the erase line 58. Table B lists the voltages applied to the select line and data line corresponding to the particular row and column of a selected individual memory cell 20 for performing the erase, write and read operations in accordance with the procedures outlined above in connection with FIGS. 5a-5d. While Table B refers to the voltages applied to the select and data lines corresponding to the one selected memory cell, all other select and data lines are maintained at the voltages specified in Table B under the heading "Before".

TABLE B

| Operation | Erase | | Write | | | Read | |
|---|---|---|---|---|---|---|---|
| Line | Before | After | Before | "0" | "1" | Before | After |
| Select (52) | 0V | 0V | 0V | +17V | +17V | 0V | +5V |
| Data (54) | +17V | +17V | +17V | +17V | 0V | | Sense |
| Erase (58) | 0V | +17V | 0V | 0V | 0V | 0V | 0V |
| Read (56) | +17V | +17V | +17V | +17V | +17V | +17V | +17V |

During the read operation, a latch 64 individually compares the output voltage on each data line 54 with a reference voltage derived from the source 26" of a reference transistor 66 in a row of reference transistors 66, the latch assuming one of two resettable logic states which is sent to the central processing unit. The reference transistors 66 are similar to the FATMOS transistor 20 in that they each share a common source 26" and drain 28" in the reference row and each reference transistor 66 shares one control gate 38 in common with a corresponding column of FATMOS transistors 20. However, the gate 32" of each reference transistor 66 is not a floating gate in that it is connected to the overlying control gate 38 so that the state of each reference transistor 66 is predetermined to correspond to the charged (or logic "1") state of the FATMOS transistors 20 and provides a reliable comparison voltage furnished to the latch 64 through a reference line 68 connected to the common source diffusion 26". The latch compares the reference voltage on the reference line 68 with the voltage sensed on each selected data line 54 to generate a plurality of logic outputs.

Figure 7:
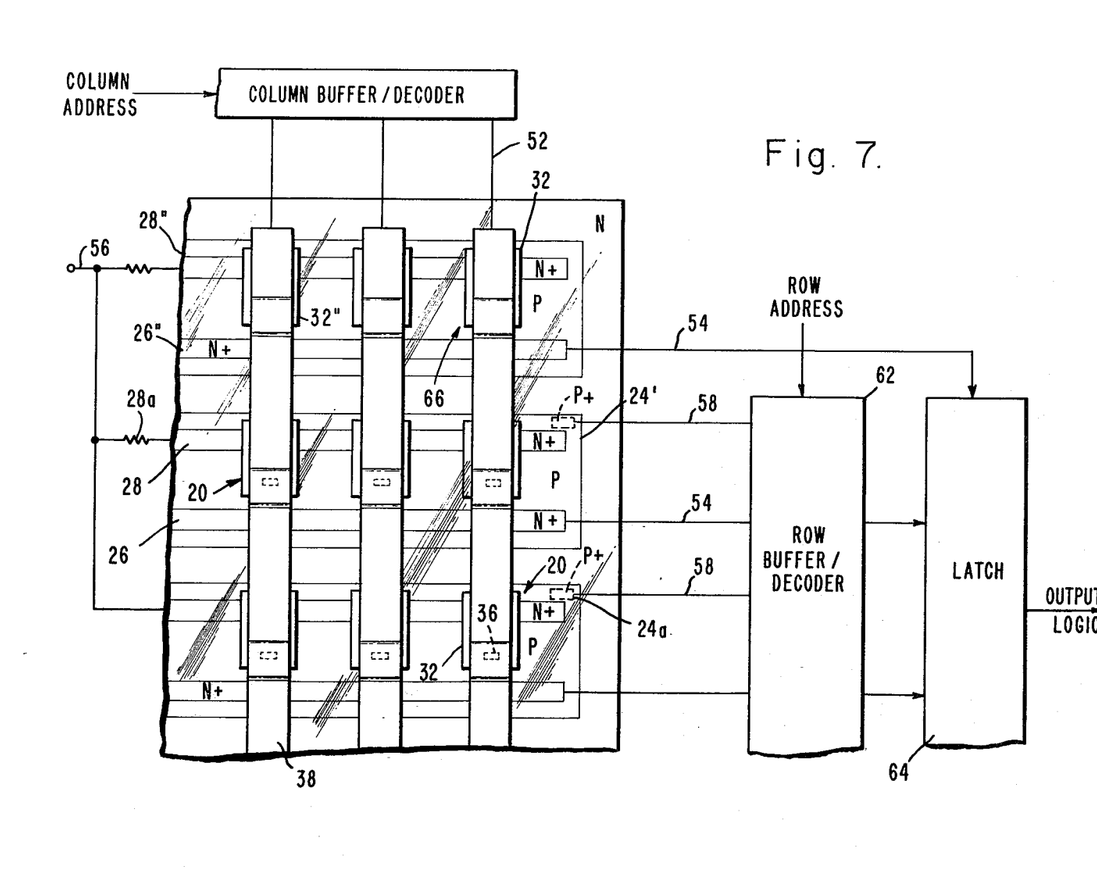
FIG. 7 is a simplified plan view of an alternative embodiment EEPROM of the present invention similar to that illustrated in FIG. 6 but which is bit-erasable.

Erasure of the memory of FIG. 6 is accomplished by manipulating the voltages applied to the control lines 52, 54, 56, 58 in accordance with Table B so that, when the erase line is raised from 0 volts to +17 volts potential, all of the memory cells 20 are erased simultaneously. However, in an alternative embodiment of the invention illustrated FIG. 7, the memory may be bit-erasable by forming plural individual well region 24', each row of FATMOS memory cells 20 formed in an individual one of the well regions 24', the well regions 24' being mutually insulated from one another by intervening substrate spacings of n-type conductivity. In the embodiment of FIG. 7, the row buffer decoder 62 not only controls a plurality of data lines 54 but may also control an equal plurality of erase lines 58 which are individually addressable through the row decoder 62, although a separate row decoder may be used for this purpose. The column of the particular memory cell selected for erasure is addressed by maintaining all select lines 52 at +17 volts except the one corresponding to the column of the selected cell. The row of the memory cells selected for erasure is addressed by maintaining all of the erase lines 58 at ground potential except that one corresponding to the row of the selected cell. The selected cell is erased by grounding its corresponding select line 52 and raising its corresponding erase line 58 to +17 volts. During an erase operation, the drain line 56 and all data lines 54 are held at +17 volts.

In summary, the EEPROM of the present invention eliminates the necessity for more than one transistor in each memory cell. Although this was accomplished previously in EEPROMS using the half-select technique discussed above, this invention avoids the occurrence of half-selected memory cells because, during the write operation of this invention, the control gate-to-substrate potential is held below the threshold required for tunnelling in all memory cells except the one selected for writing. Although the control gate-to-substrate potential is controlled in the foregoing description by controlling the potential of the p-type well region 24, the same control may be exercised in the absence of a well 24 if the n-channel device 20 is built on a p-type substrate 22' and the potential of the substrate 22' itself is controlled in the same manner as the potential of the well 24 is controlled in FIGS. 5a-5e during the erase and write operations. However, elimination of the p-type well 24 in this manner may make it impractical to provide other functions such as decoders on the same substrate 22'.

Although the invention described herein includes an n-channel FATMOS transistor 20 formed in a p-type well 24 having a floating gate 32 comprising polycrystalline silicon and an overlying control gate 38 comprising aluminum, the polarity of the device may be reversed so that it comprises p-channel FATMOS transistors formed in an n-type well on a p-type substrate. In such a case, the floating gate 32 would prevent source-to-drain current flow whenever a sufficient number of electrons have been removed so that the floating gate 32 assumes a net positive charge, while source-to-drain current flow would be permitted by the floating gate 32 whenever it is charged with electrons taken from the n-type well region. Furthermore, other materials may be selected to form the floating gate 32 and the overlying control electrode 38. The preferred bulk C-MOS process for fabricating the EEPROM illustrated in FIG. 6 is as follows:

Fabricate the semiconductive substrate 22 of n-type conductivity silicon. Form a field oxide layer having a thickness on the order of 5,000 Angstroms over the entire top surface of the semiconductor substrate 22 by growing silicon dioxide thereover. Form the well region 24 of p-type conductivity by ion implanting boron into the top surface of the silicon substrate 22 where the silicon dioxide has been etched away to define the well pattern. Form the plurality of n-type source drain regions 26, 28 by diffusing or ion implanting an impurity such as phosphorus or arsenic. Implant or diffuse the control region 24a of the p-type well with boron so as to increase the p-type conductivity of the contact area 24a. Ion implant the entire top surface of the p-type well 24 with boron except in the channels 30 and ion implant the region outside of the well 24 with phosphorus, so that the resulting concentration of implanted boron and phosphorus ions is sufficient to allow application of 17 volts through overlying conductors (such as the control electrode 38) without inverting the surface of the substrate 22. Expose the surface of the channel 30. Form the gate oxide 34 by growing silicon dioxide in a layer of thickness on the order of 500 to 1,000 Angstroms. Form the tunnel region 36 by controlling the thickness of the gate oxide layer 34 in the tunnel region 36 to be on the order of 100 to 200 Angstroms. Deposit the polycrystalline silicon floating gate 32. Deposite a silicon nitride film over the entire device to insulate the floating gate 32. Form contact openings to the diffusions 26, 28 and the gates 38 as required. Deposit an aluminum metal film over the nitride film and photolithographically define therein the control gates 38 and the conductor buses 54, 56 connecting to the source and drain diffusion pairs 26, 28.

Superior metal oxide semiconductor processes may also be useful, including state-of-the-art processes now under development (such as self-aligned silicon gate processes) and it would be within the discretion of a skilled worker to modify the foregoing process so as to include state-of-the-art advancements in processing technology.

What is claimed is:

1. An electrically erasable and programmable transistor, comprising:
   a semiconductor substrate;
   a source and a drain defining a channel region therebetween in said substrate;
   an insulated floating gate at least partially overlying said channel region;
   a dielectric film between said floating gate and said substrate, said film having a thin tunneling region overlying said channel region;
   a control gate overlying said floating gate and spanning said channel region, said control gate insulated from said floating gate and from said substrate; and
   means for setting the potential of said channel region to be sufficiently more attractive to electrons than the potential of said overlying control gate so as to cause electrons to tunnel from said floating gate to said channel region, and for setting said channel region potential to be sufficiently less attractive so as to prevent electrons from tunneling from said floating gate to said channel region and allow electrons to tunnel from said channel region to said floating gate.

2. An electrically erasable and programmable transistor, comprising:
   a semiconductive substrate of a first conductivity type;
   a well region in said substrate of a second conductivity type;
   a source and a drain of said first conductivity type inside said well region defining a channel region therebetween;
   an insulated floating gate at least partially overlying said channel region;
   a dielectric film between said floating gate and said substrate, said film having a thin tunneling region overlying said channel region;
   a control gate overlying said floating gate and spanning said channel region, said control gate insulated from said floating gate and from said substrate; and
   means for setting the potential of said well region to be sufficiently more attractive to electrons than the potential of said overlying control gate so as to cause electrons to tunnel from said floating gate to said channel region, and for setting the potential of said well region to be less attractive so as to prevent electrons from tunneling from said floating gate to said channel region and allow electrons to tunnel from said channel region to said floating gate.

3. An electrically erasable and programmable transistor, comprising:
   a semiconductive substrate;
   a source and a drain defining a channel region therebetween in said substrate;
   an insulated floating gate at least partially overlying said channel region;
   a dielectric film between said floating gate and said substrate, said film having a thin tunneling region overlying said channel;
   a control gate overlying said floating gate and spanning said channel region, said control gate insulated from said floating gate and from said substrate;
   means for setting the potential of said overlying control gate to be sufficiently more attractive to electrons than the potential of said channel region to allow electrons to tunnel from said channel region to said floating gate; and
   means for lowering the potential of said source so that electrons flow from said source into said channel region and tunnel to said floating gate whenever said control gate is set at said attractive potential, and for setting the potential of said source to be sufficiently near the potential of said drain to stop electrons from flowing from said source into said channel and prevent electron tunneling to said floating gate.

4. An electrically erasable and programmable transistor, comprising:
   a semiconductive substrate of a first conductivity type;
   a well region in said substrate of a second conductivity type;
   a source and a drain of said first conductivity type inside said well region defining a channel region therebetween;
   an insulated floating gate at least partially overlying said channel region;
   a dielectric film between said floating gate and said substrate, said film having a thin tunneling region overlying said channel region;
   a control gate overlying said floating gate and spanning said channel region, said control gate insulated from said floating gate and from said substrate;
   means for setting the potential of said overlying control gate to be sufficiently more attractive to electrons than the potential of said well region to allow electrons to tunnel from said channel region to said floating gate; and means for lowering the potential of said source so that electrons flow from said source into said channel region and tunnel to said floating gate whenever said control gate is set at said attractive potential, and for setting the potential of said source to be sufficiently near the potential of said drain to stop electrons from flowing from said source into said channel and prevent electron tunneling to said floating gate.

5. An electrically erasable programmable read only memory formed on a first conductivity type semiconductive substrate, comprising:

an opposite conductivity type well region in the top surface of said substrate;

a plurality of first conductivity type source and drain strips in said well region arranged in source and drain pairs extending parallel to one another in transverse rows of said pairs;

a plurality of control gate conductive strips overlying said substrate and insulated therefrom, said control gate strips extending parallel to one another in longitudinal columns overlying said transverse rows to define a plurality of source-to-drain channel regions underlying said control gate strips;

a plurality of insulated floating gates overlying individual ones of said channel regions;

an insulating film between said plurality of floating gates and said substrate, including a plurality of thin tunneling regions individually overlying said source-to-drain channel regions; and means for setting the potential of said well region to be sufficiently more attractive to electrons than the potential of at least one of said overlying control gate strips so as to cause electrons to tunnel from at least one of said floating gates to said substrate, and for setting the potential of said well region to be less attractive so as to prevent electrons from tunneling from said plurality of floating gates to said substrate and allow electrons to tunnel from at least one of said channel regions to a corresponding one of said floating gates.

6. An electrically erasable programmable read only memory formed on a first conductivity type semiconductive substrate, comprising:

an opposite conductivity type well region in the top surface of said substrate;

a plurality of first conductivity type source and drain strips in said well region arranged in source and drain pairs extending parallel to one another in transverse rows of said pairs;

a plurality of control gate conductive strips overlying said substrate and insulated therefrom, said control gate strips extending parallel to one another in longitudinal columns overlying said transverse rows to define a plurality of source-to-drain channels underlying said control gate strips;

a plurality of insulated floating gates overlying individual ones of said channels;

an insulating film between said plurality of floating gates and said substrate, including a plurality of thin tunneling regions individually overlying said source-to-drain channels;

means for setting the potential of a selected one of said overlying control gate strips to be sufficiently more attractive to electrons than the potential of said well region to allow electrons to tunnel from said well region to at least one of said floating gates; and means for lowering the potential of a selected one of said source strips so that electrons flow from said source strip beneath said selected control gate strip and tunnel into the corresponding one of said plurality of floating gates whenever said selected control gate strip is set at said attractive potential, and for setting the potential of unselected ones of said source strips to be sufficiently near the potentials of said plurality of drain strips to stop electrons from flowing from said unselected source strips beneath said plurality of control gate strips.

7. An electrically erasable programmable read only memory formed on a semiconductive substrate, comprising:

a plurality of source and drain strips in said substrate arranged in source and drain pairs extending parallel to one another in transverse rows of said pairs;

a plurality of control gate conductive strips overlying said substrate and insulated therefrom, said control gate strips extending parallel to one another in longitudinal columns overlying said transverse rows to define a plurality of source-to-drain channel regions underlying said control gate strips;

a plurality of insulated floating gates overlying individual ones of said channel regions;

an insulating film between said plurality of floating gates and said substrate, including a plurality of thin tunneling regions individually overlying said source-to-drain channel regions; and means for setting the potentials of said plurality of channel regions to be sufficiently more attractive to electrons than the potential of at least one of said overlying control gate strips so as to cause electrons to tunnel from at least one of said floating gates to said substrate, and for setting the potentials of said channel regions to be less attractive so as to prevent electrons from tunneling from said plurality of floating gates to said substrate and allow electrons to tunnel from at least one of said channel regions to a corresponding one of said floating gates.

8. An electrically erasable programmable read only memory formed on a semiconductive substrate, comprising:

a plurality of source and drain strips in said substrate arranged in source and drain pairs extending parallel to one another in transverse rows of said pairs;

a plurality of control gate conductive strips overlying said substrate and insulated therefrom, said control gate strips extending parallel to one another in longitudinal columns overlying said transverse rows to define a plurality of source-to-drain channel regions underlying said control gate strips;

a plurality of insulated floating gates overlying individual ones of said channel regions;

an insulating film between said plurality of floating gates and said substrate, including a plurality of thin tunneling regions individually overlying said source-to-drain channel regions;

means for setting the potential of a selected one of said overlying control gate strips to be sufficiently more attractive to electrons than the potential of said substrate to allow electrons to tunnel from said substrate to at least one of said floating gates; and means for lowering the potential of a selected one of said source strips so that electrons flow from said source strip into the corresponding one channel region underlying said selected control gate strip and adjacent said selected source strip and tunnel into the corresponding floating gate whenever said selected control gate strip is set at said attractive potential.

9. An electrically bit-erasable programmable read only memory formed on a semiconductive substrate of a first conductivity type, comprising:

a plurality of mutually isolated well regions of a second conductivity type in said substrate;

a plurality of source and drain strips of said first conductivity type arranged in source and drain pairs extending parallel to one another in transverse rows of said pairs, each of said pairs individually residing in a corresponding one of said well regions;

a plurality of control gate conductive strips overlying said substrate and insulated therefrom, said control gate strips extending parallel to one another in longitudinal columns overlying said transverse rows to define a plurality of source-to-drain channel regions underlying each of said control gate strips;

a plurality of insulated floating gates, each of said floating gates overlying individual ones of said channel regions;

an insulating film between of said floating gates and said substrate, including a plurality of thin tunneling regions individually overlying each of said channel regions; and means for applying a potential to selected ones of said well regions, said potential being sufficiently more attractive to electrons than the potential of the corresponding control gate strips, so as to cause electrons to tunnel from corresponding ones of said floating gates to said substrate, and for removing said attractive potential so as to prevent electron tunneling from said floating gates and allow electrons to tunnel from at least one of said channel region to said floating gate.

10. The device of claims 1, 2, 3, or 4 wherein said floating gate overlies only a portion of said channel region adjacent one of said source and drain, while said control gate overlies at least the remaining channel region portion adjacent the other of said source and drain, so that charge flow in said remaining portion is regulated by said control gate independently of said floating gate.

11. The device of claims 5, 6, 7 or 8 wherein each of said floating gates overlies only a portion of the underlying one of said source-to-drain channel regions, said portion being adjacent one of the corresponding source strip and drain strip, the remaining portion of said one channel region being adjacent the other of said corresponding source strip and drain strip and underlying a corresponding one of said control gate strips, so that charge flow in said remaining portion is regulated by said corresponding control gate strip independently of said floating gate.

12. The device of claims 2 or 4 wherein:
said first and second conductivity types are n and p respectively and said minority carriers are electrons;
said substrate comprises silicon of n-type conductivity;
said source and drain comprise one of arsenic impurities and phosphorus impurities in said substrate; and
said well region comprises implanted boron impurities in said substrate.

13. The device of claims 2 or 4 wherein the concentration of dopant impurities in said well region is sufficient to prevent inversion of the substrate surface during application of voltages in the range of 10 to 20 volts to said control gate strips.

14. The device of claims 1, 2, 3 or 4 wherein:
said dielectric film comprises silicon dioxide;
said floating gate comprises polycrystalline silicon; and
said control gate comprises aluminum, said control gate being insulated from said floating gate and from said substrate by an intervening layer of silicon nitride.

15. The device of claims 5, 6, 7 or 8 further including:
(a) a plurality of reference transistors arranged in a transverse row in said substrate, said plurality of reference transistors comprising:
  1. a reference source strip and a reference drain strip in said substrate extending parallel to one another lengthwise in said transverse row so as to underlie each of said longitudinal column control gate strips and define a plurality of source-to-drain reference channels underlying said control gate strips; and
  2. a plurality of insulated gates individually overlying said reference channels and connected to the overlying one of said control gate strips; and
(b) means for comparing the source-to-drain potential of a selected one of said source and drain pairs with that of one of said reference transistors and for resettably latching into a binary logic state in accordance with said comparison.

16. The device of claims 5, 6, 7 or 8 further comprising:
a column decoder individually connected to each of said control gate strips; and
a row decoder individually connected to at least said plurality of source strips.

17. The device of claim 1 wherein said means for setting the potential of said channel region comprises a well region in said substrate of a conductivity type opposite to that of said source and drain, said source and drain being disposed in said well region, and a contact region of increased impurity concentration of said opposite conductivity type in said well including means for applying a positive potential to said contact region while applying a less positive potential to said overlying control gate to cause electrons to tunnel from said floating gate to said channel region.

18. The device of claim 9 wherein said applying means applies a positive potential on the order of 17 volts to said contact region while applying a potential on the order of zero volts to said control gate to cause electrons to tunnel from said floating gate to said channel region.

19. The device of claim 3 wherein:
said means for setting said overlying control gate potential comprises means for applying a positive voltage to said control gate while setting the potential of said channel region to approximately ground potential to allow electrons to tunnel to said floating gate; and said means for lowering the potential of said source comprises means for applying a voltage to said source which is less positive than that applied to said control gate to cause electrons from said source to tunnel to said floating gate whenever said control gate is set at said positive voltage, and for applying a positive voltage to both said source and said drain to stop electrons from said source from tunneling to said floating gate.

20. The device of claim 11 wherein said setting means applies a voltage on the order of positive 17 volts to said control gate and said lowering means applies a voltage on the order of zero volts to said source to cause electrons to tunnel to said floating gate and applies a positive voltage on the order of 17 volts to both said source and said drain to stop electrons from said source from tunneling to said floating gate.

* * * * *

(12) REEXAMINATION CERTIFICATE (4508th)

United States Patent
Wanlass (10) Number: US 4,375,087 C1
(45) Certificate Issued: Jan. 1, 2002

(54) ELECTRICALLY ERASABLE PROGRAMMABLE READ-ONLY MEMORY

(75) Inventor: Frank M. Wanlass, Cupertino, CA (US)

(73) Assignee: Hughes Aircraft Company, Culver City, CA (US)

Reexamination Request:
No. 90/004,400, Sep. 30, 1996

Reexamination Certificate for:
Patent No.: 4,375,087
Issued: Feb. 22, 1983
Appl. No.: 06/138,806
Filed: Apr. 9, 1980

(51) Int. Cl.[7] .............................................. G11C 13/00
(52) U.S. Cl. ............... 365/218; 365/185.01; 365/185.1; 357/45

(56) References Cited

U.S. PATENT DOCUMENTS 4,115,914 A 9/1978 Harari .......................... 29/571

OTHER PUBLICATIONS

T.H. Ning and C.M. Osburn, "Self–Aligned Stack–Gate Igfet Device Having An Underlying P–N Junction For Charge Injection," *IBM Technical Disclosure Bulletin*, vol. 21, No. 1, p. 402, (Jun. 1978).

Jan F. Verwey and Roel P. Kramer, "Atoms—An Electrically Reprogrammable Read–Only Memory Device," *IEEE Transactions on Electron Devices*, vol. Ed.–21, No. 10, pp. 631–636 (Oct. 1974).

*Primary Examiner*—Terrell W Fears (57) ABSTRACT

A floating gate tunneling metal oxide semiconductor (FATMOS) transistor is formed in a well region on a semiconductive substrate of a conductivity type opposite to that of the well region, so that charging and discharging of the FATMOS floating gate is accomplished by controlling the potential of the well region. As a result, in an electrically erasable programmable read-only memory, each memory cell requires only one FATMOS transistor, the need for an additional control transistor having been eliminated. Selection of individual memory cells is enhanced by providing a floating gate which only partially overlies the FATMOS transistor channel, so that the overying FATMOS control electrode performs an "and" gate function independently of the floating gate.

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 15 and 17–20 is confirmed.

Claims 1–14 and 16 are cancelled.

\* \* \* \* \*